United States Patent [19]

Nagesh et al.

[11] Patent Number: 5,248,656
[45] Date of Patent: Sep. 28, 1993

[54] METHOD OF MAKING SUPERCONDUCTOR WIRES, OR CAPILLARIES

[75] Inventors: V. K. Nagesh, Cupertino; John P. Scalia, San Jose, both of Calif.

[73] Assignee: Hewlett-Packard Company, Palo Alto, Calif.

[21] Appl. No.: 595,644

[22] Filed: Oct. 9, 1990

Related U.S. Application Data

[62] Division of Ser. No. 34,867, Apr. 6, 1987, abandoned.

[51] Int. Cl.$^5$ ............... H01L 39/12; C04B 35/60; C04B 35/00
[52] U.S. Cl. ............................... 505/1; 264/61; 264/104; 264/332; 427/62; 505/740; 505/742
[58] Field of Search ............... 505/1, 725, 739, 740, 505/742, 780; 264/56, 61, 62, 332, 104; 427/62

[56] References Cited

U.S. PATENT DOCUMENTS

| | | |
|---|---|---|
| 3,657,466 | 4/1972 | Woolcock et al. ............... 174/15 S |
| 3,781,455 | 12/1973 | Hildebrandt ....................... 174/15 S |
| 3,800,061 | 3/1974 | Larson et al. ...................... 174/15 S |
| 4,036,618 | 7/1977 | Leonard et al. .................... 174/15 S |
| 4,039,740 | 8/1977 | Iwata ................................. 174/15 S |
| 4,152,386 | 5/1979 | Winter .............................. 264/108 |
| 4,334,123 | 6/1982 | Tada et al. ......................... 174/15 S |
| 4,341,924 | 7/1982 | Gleim ................................ 174/15 S |
| 4,394,534 | 7/1983 | Bahder et al. ..................... 174/15 S |
| 5,045,526 | 9/1991 | Nagesh et al. ..................... 505/740 |

Primary Examiner—Jan H. Silbaugh
Assistant Examiner—Christopher A. Fiorilla

[57] ABSTRACT

A method for producing superconductor wire characterized by forming a solid superconductor preform, suspending the preform within an oven such that a portion of it is heated to approximately its melting point, and drawing on the melted portion of the preform to form a superconductor wire. If the preform is solid, so is the drawn wire, and if the preform is hollow, the drawn wire becomes a capillary. Superconductor wires can be intertwined, or can be intertwined with ordinary conductive wires or non-conductive tubing to form superconductor cables. A superconductor transmission line is made by coating a copper tube with subsequent superconductor, insulating, and protective layers.

32 Claims, 5 Drawing Sheets

METHOD OF MAKING SUPERCONDUCTOR WIRES, OR CAPILLARIES

This is a divisional of copending application Ser. No. 07/034,867 filed on Apr. 6, 1987, now abandoned.

BACKGROUND OF THE INVENTION

1. Field of the Invention

This invention relates generally to transmission lines and more particularly to superconducting transmission lines.

2. Description of the Related Art

Superconductivity is a well-known phenomenon. For example, K. H. Onnes, as early as 1911, demonstrated that the electrical resistance of mercury drops to zero when it is cooled to approximately 4° Kelvin (K).

Superconductivity has many potential uses. For example, superconducting power lines can save a great deal of energy which is otherwise dissipated during transmission. Superconducting magnets, generators, and motors, can be made small and extremely powerful. Superconducting devices known as Josephson junctions are extremely fast electronic switches having very low power consumption. In short, the potential uses for superconducting materials are so many and varied, that a list of possible applications can continue almost ad infinitum.

Despite all of the potential benefits of superconducting devices and structures, they are currently rarely found outside of research laboratories. A major reason for this is that it is extremely difficult and expensive to cool most materials to their superconducting transition temperature $T_c$. This is because most materials have a transition temperature within a few degrees Kelvin of absolute zero, requiring the use of expensive and hard to maintain liquid helium as a cooling agent. It is the astronomical costs of producing and maintaining liquid helium systems that heretobefore made superconductor applications impractical for most purposes.

On Mar. 2, 1987, M.K. Wu et al., announced superconductivity in multi-phase YBaCuO at temperatures above that of liquid nitrogen in an article entitled "Superconductivity at 93 K in a New Mixed-Phase Y—Ba—Cu—O Compound System at Ambient Pressure", Physical Review Letters, Volume 58, Number 9. This announcement caused considerable excitement in the scientific community because, for the first time, a superconductor material had been discovered which could use liquid nitrogen as a coolant. Since liquid nitrogen cooling systems are at least an order of magnitude less expensive than liquid helium cooling systems, all manner applications for superconductors suddenly became practical after Wu et al.'s discovery.

After Wu et al.'s announcement, superconductor researchers quickly divided into two major groups. One group began to experiment with bulk YBaCuO in order to discover and characterize its properties. The other group began to experiment with thin films of YBaCuO with a focus on integrated circuit technology and the aforementioned Josephson junction device.

Research into other applications for this relatively high-temperature superconductor appear to be lagging. For example, there is no mention in the literature of a practical method for making YBaCuO into a superconductor wire or cable. This is probably due to the fact that multi-phase YBaCuO is a brittle, ceramic type material, which is difficult to form into macrostructures such as wires and cables.

Other brittle materials have, however, been successfully formed into fibers. For example, glass has been drawn into long fibers for optical transmission. An explanation of how optical fibers can be manufactured is found in an article entitled "Drawing Lightguide Fiber", by D.H. Smithgall et al., The Western Electric Engineer, Winter 1980, pp. 49+. However glass is a very different substance than superconducting YBaCuO, and the methods for forming glass into a fiber and for forming YBaCuO into wires differ considerably.

SUMMARY OF THE INVENTION

An object of this invention is to provide practical, economical superconductor wires and cables.

A method for producing superconductor wire in accordance with the present invention includes the steps of sintering a superconductor powder to form a solid superconductor preform; suspending the preform within an oven such that a portion of the preform is heated to near its melting point; and drawing on the melted portion of the preform to form a superconductor wire. Additional method steps include annealing the wire to increase the superconducting phases in the wire, and coating the wire to increase ductility, durability, and/or room temperature conductivity.

A method for producing superconductor cable includes the step of intertwining a number of individual superconductor wires. A further step includes the intertwining of wires made from a material which is conductive at ordinary room temperatures, with the superconductor wires. Either or both the superconductor wires and the conductor wires can be capillaries to serve as conduits for fluid refrigerants.

These and other objects and advantages of the present invention will become apparent to those skilled in the art after reading the following descriptions and studying the various figures of the drawing.

DETAILED DESCRIPTION OF THE PREFERRED EMBODIMENTS

The preferred embodiments of the present invention will be discussed in terms of the new YBaCuO class of high temperature superconductors that were discovered by Wu et al., supra. However, it should be apparent to those skilled in the art that the methods and structures described herein could be practiced with a wide variety of superconducting materials, many of which are yet to be discovered.

As is explained in detail in the Wu et al. paper, YBaCuO is a specific example of a compound system which is generally represented by $(L_{1-x}M_x)_aA_bD_y$, where L=Y, M=Ba, A=Cu, D=O, x=0.4, a=2, b=1, and y<=4. Other, related high $T_c$ superconductors within the above general representation include LaBaCuO and LaSrCuO.

In the prior art, YBaCuO samples are prepared from mixtures of high purity $Y_2O_3$, $BaCO_3$, and CuO powders. The powders are mixed in a solvent, such as methanol or water, and subsequently heated to 100° C. to evaporate the solvent. The resultant mixture is then heated for six hours in air at 850° C. to produce a dark, green powder. The green powder is then heated for an additional six hours at 1000° C. to become a black, porous solid. A detailed explanation of the method steps involved in the manufacture of superconducting YBaCuO and a description of some of its properties can be found in a paper entitled "Superconductivity and Magnetism in High-$T_c$ Superconductor YBaCuO", J. Z. Sun, et al., Department of Applied Physics, Stanford University, PACS #: 74.30.-E, 74.70.-B.

Figure 1:
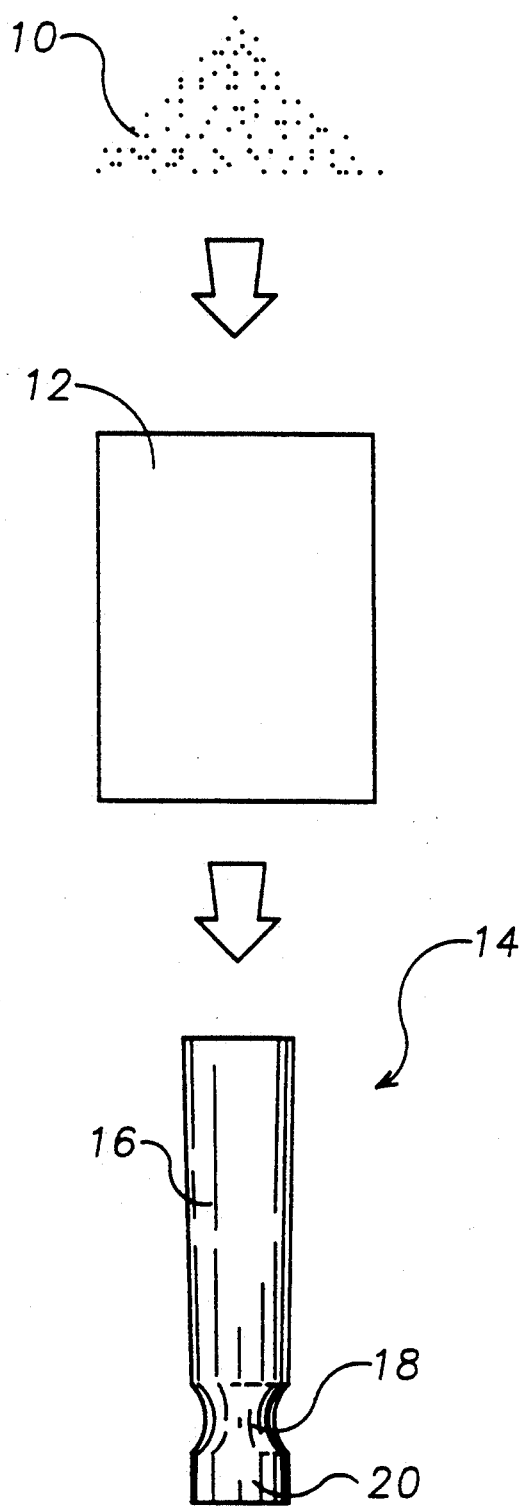
FIG. 1 illustrates the method steps for producing a superconductor preform.

Referring to FIG. 1, a method for making a superconductor wire in accordance with the present invention starts with a supply of powdered superconductor 10. In the case of a YBaCuO-based material, the powdered superconductor can be made by mixing $Y_2O_3$, $BaCO_3$, and CuO in the proportions of 24:42:34, milling the compounds for 1-12 hours, and then calcining (i.e., reducing to a powder by heat) the milled compounds at a temperature of 750°-900° C. for 4-8 hours. Other suitable mixture proportions include 15:53:32; and 18.5:65:16.5. The calcined powders can be then mixed with a binder (such as polyvinyl alcohol 1-5%) in a suitable solvent (such as isopropyl alcohol) to form a mixture. The mixture can then be milled in a ball mill for approximately 1-12 hours to form a fine, uniform slurry. After ball milling, the solvents can be driven out by filtration, and the wet precursor is dried into a fine powder.

Once the powdered superconductor precursor 10 has been made, it is placed into a preform apparatus 12. One type of preform apparatus 12 utilizes a cold press process to form the powdered precursor into rods, and an oven which sinters the rods at temperatures of 950°-1100° C. for a length of time which varies with the particular application. The sintering causes the superconductor precursor of the rod to convert into a superconductor phase, as explained previously. A second type of preform apparatus 12 uses a hot press at temperatures of 950°-1100° C. to simultaneously form the rods and sinter the superconductor precursor to create the a superconductor phase.

A typical rod or preform 14 produced by the preform apparatus 12 is illustrated at the bottom of FIG. 1. The preform 14 includes a body portion 16, a neck portion 18, and a head portion 20.

There are a number of factors to be considered in the process of converting a superconductor preform into a superconductor wire. First, to ensure that the wire which is formed from the superconductor preform is, indeed, a superconductor, it is important to crystalize a continuous superconductor phase out of a melted portion of the superconductor precursor. Chemical analysis indicates that such a superconducting phase to be characterized by the formula $Ba_2YCu_3O_{6-.8}$, which is superconducting at temperatures below 88° K. Second, the melted portion of the preform should not contact any other material to maintain the purity of the wire being produced, and to avoid undesirable chemical reactions. A high reactivity has been observed with YBaCuO with many common containment materials, even at relatively low temperatures. Third, while the superconductor material is strong and hard (about 62 Rockwell) it is also very brittle. Therefore, the diameter of the wire should be kept small (for example, 50 mils) to maintain flexibility.

Figure 2:
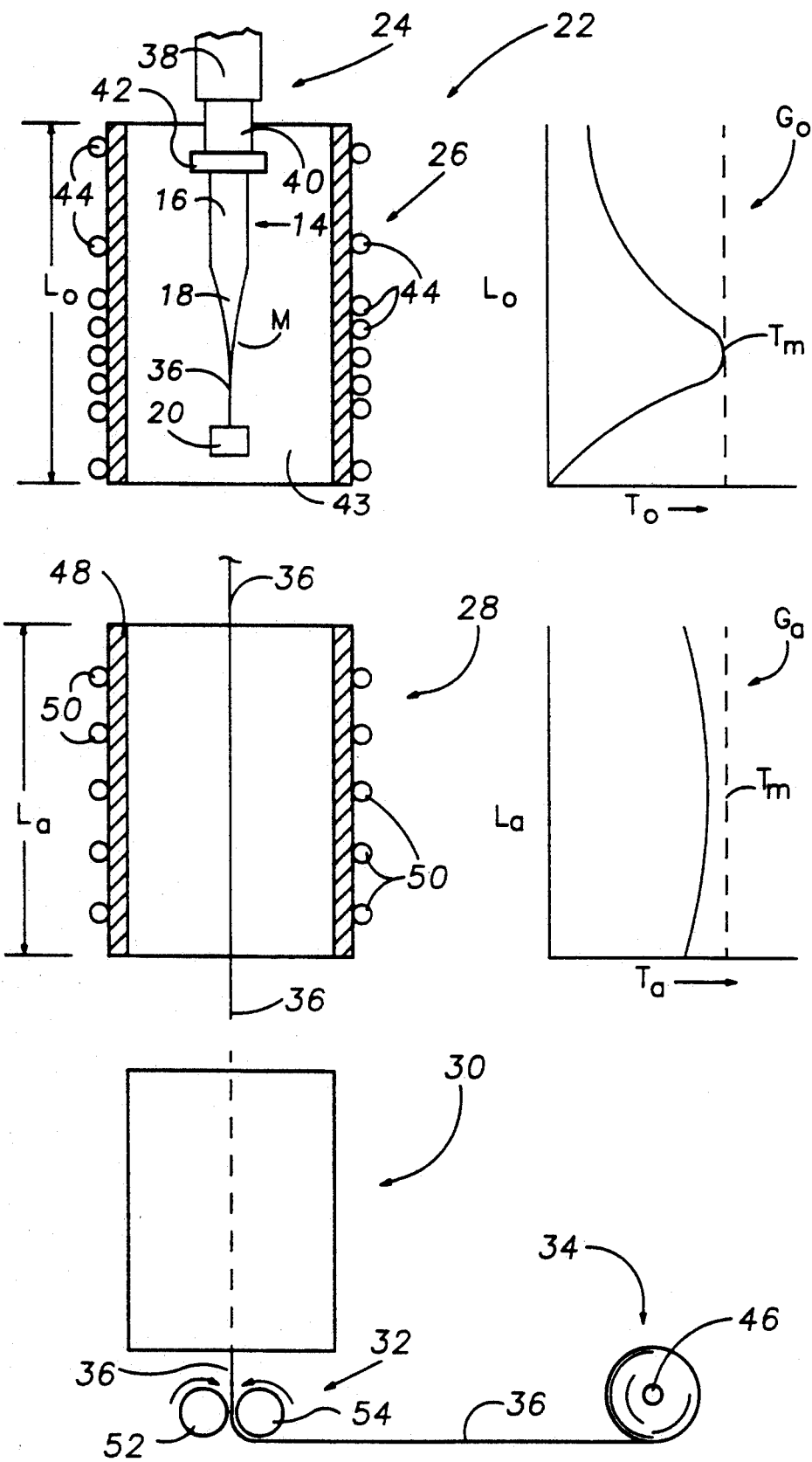
FIG. 2 illustrates an apparatus for producing superconductor wire from a superconductor preform.

Referring now to FIG. 2, a method and apparatus for making superconductor wire will be discussed. An apparatus 22 for forming superconductor wire includes a feed mechanism 24, an oven 26, an annealer 28, a coater 30, a drawing mechanism 32, and a spooler 34. Several forms of the superconductor wire 36 are shown at various locations.

The feed mechanism 24 includes a column 38, a post 40, and a chuck 42. The post 40 and chuck 42 can move upwardly and downwardly relative to column 38 and oven 26. Column 38 can, for example, be a hydraulic or pneumatic cylinder, while post 40 can be a piston. Alternatively, post 40 can be driven upwardly and downwardly by means of an electric motor, such as a stepper motor, with appropriate gearing.

The chuck 42 is adapted to suspend a superconductor preform 14 within the oven 26. The oven 26 includes an enclosure 43 and a resistance coil 44. The resistance coil 44 is coupled to an electrical power source (not shown) to produce heat which is transmitted to the superconductor preform 14, primarily by means of radiation. The enclosure 43 may be evacuated, or it may be filled with a gas (preferably inert), in which case there could be additional heating of the superconductor precursor by means of convection.

It should be noted that in the temperature graph $G_O$ that the temperature $T_O$ within oven 26 is non-linear. This can be accomplished, for example, by increasing the density of the windings of the resistance coil proximate to the neck 18 of superconductor preform 18. By properly adjusting the temperature $T_O$ within oven 26, the temperature of the preform 14 at neck 18 can be caused to approach the melting temperature $T_M$ of the superconductor preform 14. This causes a melt region M at a point in the neck region 18 of the superconductor preform, which forms the starting point for superconductor wire 36.

After the superconductor wire 36 is initially formed in oven 26, it can be spooled onto a reel 46 of spooler 34. However, in order to improve the characteristics of the superconductor wire 36, an annealing process may be desirable. To this end, the superconductor wire 36 can be passed through annealer 28, which includes an enclosure 48 and a resistance coil 50. The resistance coil 50 is coupled to an electrical power source (not shown) which causes the resistance coil 50 to heat the superconductor wire 36, primarily by radiation. As before, it is preferable that the superconductor wire 36 does not touch the enclosure 48 to prevent undesired contamination and/or reactions. The enclosure 48 may be evacuated, or it may be filled with a gas (which as before is preferably inert), in which case the superconductor wire 36 would also be heated, to some extent, by convection.

Referring to Graph $G_A$, the temperature within annealer 28 is considerably more linear (or has a more constant temperature zone) than the temperature within oven 26. It is desirable to keep the temperature $T_A$ within annealer 28 below the melt temperature $T_M$ of the wire 36, but high enough to insure the crystallization of a continuous superconducting phase. A suitable temperature for the annealer is approximately 900°

1000° C. It should be noted, however, that the annealing step does not have to be accomplished directly after the wire formation step, but can be accomplished considerably later, if desired.

The bare, annealed wire exiting from annealer 28 could be spooled onto reel 46 of spooler 34. However, the characteristics of the wire 36 can, in some cases, be further improved by providing a coating around the superconductor core. For this reason, the superconductor 36 can be fed through a coater 30.

The type of coating applied to the superconductor wire 36 by coater 30 can be varied according to the ultimate application of the superconductor wire 36. For example, a hermetic, insulating coating can be applied to the superconductor wire 36 to improve the wire's durability and to prevent contamination or reaction of the superconductor portion of the wire. Alternatively, a metallic coating, such as copper or silver, can be applied to the core of the superconductor wire 36 to increase the ductility of the wire and to reduce the resistance of the wire at ordinary room temperatures. For other applications, a semiconducting coating may be desirable, which may or may not be semiconducting at temperatures near $T_c$ of the superconductor wire 36.

The drawing mechanism 32 can include a pair of pinch rollers 52 and 54 which rotate in opposite directions, as indicated. One or both of pinch rollers 52 and 54 are driven by a driving mechanism, such as an electrically-powered stepper motor (not shown).

After exiting the pinch rollers 52 and 54, the superconductor wire 36 is wound around reel 46 of spooler 34. The driving mechanism for the reel 46 can be any suitable device such as a electrically-powered stepper motor.

It should be noted that the spooler 34 could be used to directly draw the superconductor wire 36 from the superconductor preform 14. However, the use of a separate drawing mechanism 32 may be preferable, since a more constant drawing speed can be maintained, and because it would allow the reel 46 of spooler 34 to be changed without the stopping the wire making process.

When initially starting the wire making process, the resistance coil 44 causes a portion of the neck 18 at melt point M to rise to or near the melting temperature $T_M$. The head 20 of superconductor preform 14 then causes the superconductor wire 36 to be pulled from the melt point M under the action of gravity. Once the superconductor wire 36 is long enough, the head 20 is removed from the wire, and the drawing mechanism 32 and spooler 34 continue the wire drawing process.

It is important to note that the apparatus 22 of the present invention forms the superconductor wire 36 without contacting the wire to the enclosures of either the oven or the annealer. As mentioned previously, this is because YBaCuO, at elevated temperatures, is extremely reactive. For example, YBaCuO is highly reactive with platinum, aluminum oxide, and other common container materials, even at temperatures as low as 1000° C. Near melting temperatures $T_M$ (1300°–2000° C.), a container material that will not react with YBaCuO is almost impossible to find. Therefore, this non-contact method for drawing the superconductor wire 36 is far superior to methods for making conventional wires, such as extrusion, in that it maintains the purity and minimizes the chance for reaction of the superconductor wire 36.

It should also be noted that the above described method can produce either solid wire or hollow wire (capillary). To form solid wire, a solid preform is used. To form a capillary, a hollow preform (i.e. one having a substantially annular cross-section) is used. A description of how to make capillaries from preforms can be found in U.S. Pat. No. 4,293,415 of Bente, III et al.; in "Optical Transmission in Liquid Core Quartz Fibers", by Stone, Applied Physics, April 1972, PP. 78–79; and in "Construction of Long Lengths of Coiled Glass Capillary" by Desty et al., Analytical Chemistry, vol. 32, no. 2, Feb. 1960, pp. 302–304.

As mentioned previously, the annealing step of the wire making process can be used to increase the purity of the superconductor wire 36, but is not strictly necessary. Microstructure studies indicate that the superconducting phase of superconductor wire 36 is a columnar or spaghetti-like structure which readily crystallizes out of the melt M in the oven 26. Pulling the wire 36 from this molten phase M is important in that it provides a directionality to the superconductor phase which greatly increases the efficiency of the superconductor wire 36.

Figure 3:
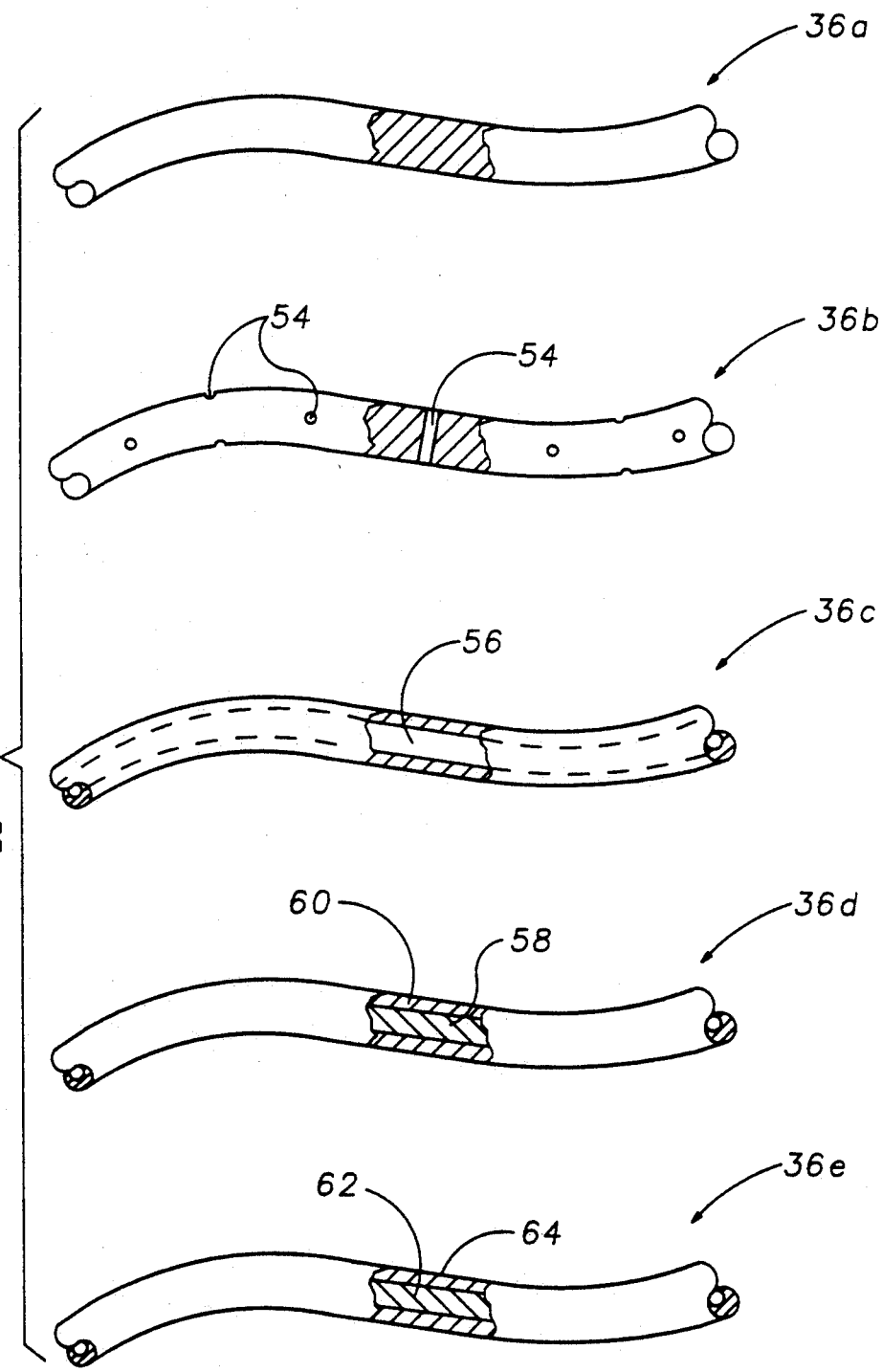
FIG. 3 illustrates a number of superconductor wire structures.

Referring now to FIG. 3, a number of structures for the superconductor wire 36 are illustrated. A first structure 36A is simply a length of solid superconductor material having a substantially circular perimeter. Another structure 36B is similar to the structure shown in 36A, but is provided with a plurality of transverse passages 54 which allow cooling fluid to flow through the superconductor wire. The transverse passages 54 can be formed, for example, with a laser-boring tool.

Another superconductor wire structure is 36C in FIG. 3 and includes a longitudinally-extending passage 56 which, in effect, makes the superconductor wire 36C a capillary. As a capillary, the superconductor wire 36 can carry its own refrigerant fluid (such as liquid or gaseous nitrogen), eliminating the need for an additional conduit to enclose the refrigerant fluid around the superconductor wire.

Another superconductor wire structure is shown at 36D to include a superconductor core 58 and a surrounding coating 60. As described previously, the coating 60 can be an insulator, a semiconductor, or a conductor at ordinary room temperatures.

Yet another structure for a superconductor wire is shown at 36E in FIG. 3. Here, the wire includes a conductive core 62, and a superconductor coating 64. This structure has several advantages, including superior ductility and malleability, and a low resistance at ordinary room temperatures. This low resistance at ordinary room temperatures may be important, because the superconductor coating 64 has a relatively high resistance a ordinary room temperatures, which increases the possibility that a superconductor wire might overheat and burn out if it were connected to a constant-current electrical power source and if the temperature of the wire rose above its superconducting transition temperature $T_C$. By combining the superconductor material with an ordinary, good conductor, this possibility can be reduced.

Figure 4:
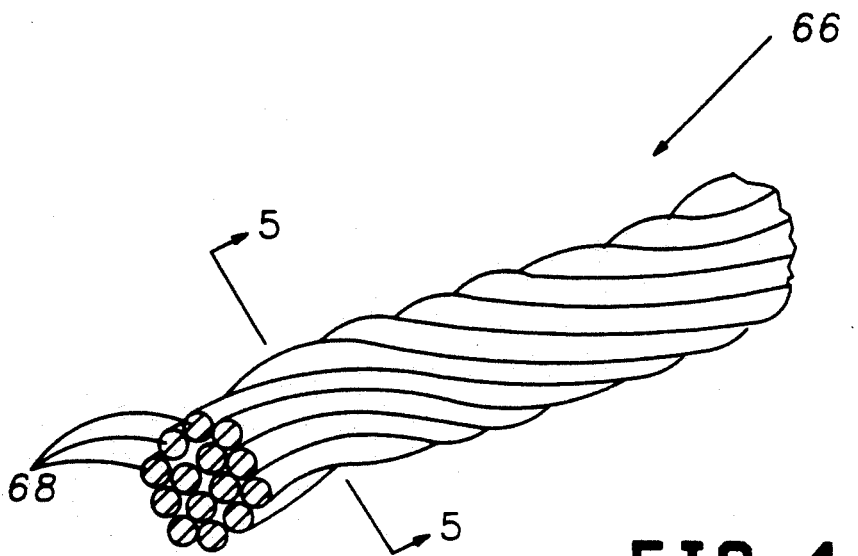
FIG. 4 is a perspective view of a superconductor cable.

With reference to FIG. 4, a superconductor cable 66 includes a number of intertwined wires 68. Apparatus and methods for twining individual wires into a cable are well known to those skilled in the art of cable making, and will not be discussed here.

Figure 5:
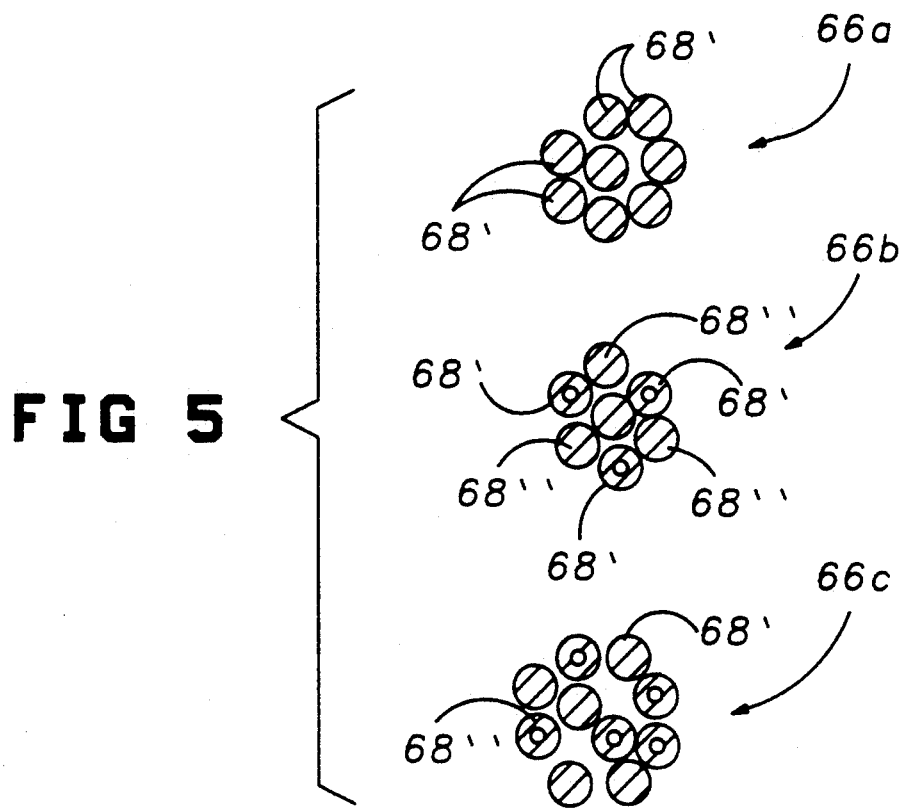
FIG. 5 illustrates a number of cross-sections for different versions of superconductor cables as taken along line 5—5 of FIG. 4.

In FIG. 5, the wires 68 can take many forms, and can be combined in many ways. For example, at 66A, the wires 68 can all be made from a solid superconductor wire 68′ such as that shown at 36A in FIG. 3. Alternatively, at 66B, the superconductor wires 68′ can be provided with a longitudinal passage to conduct refrigerant fluid, such as those wires shown at 36C in FIG. 3. The remaining wires 68″ can be ordinary, good conductors at room temperature (such as copper) to prevent the aforementioned melt-down problem.

As shown at 66C, a cable can also include the combination of solid superconductor wires 68′ with capillaries 68″ for carrying coolant fluid. The capillaries 68″ of cable 66C can be made from ordinary good conductors, for reasons stated before or, alternatively, can be made from other materials, such as plastic.

Figure 6:
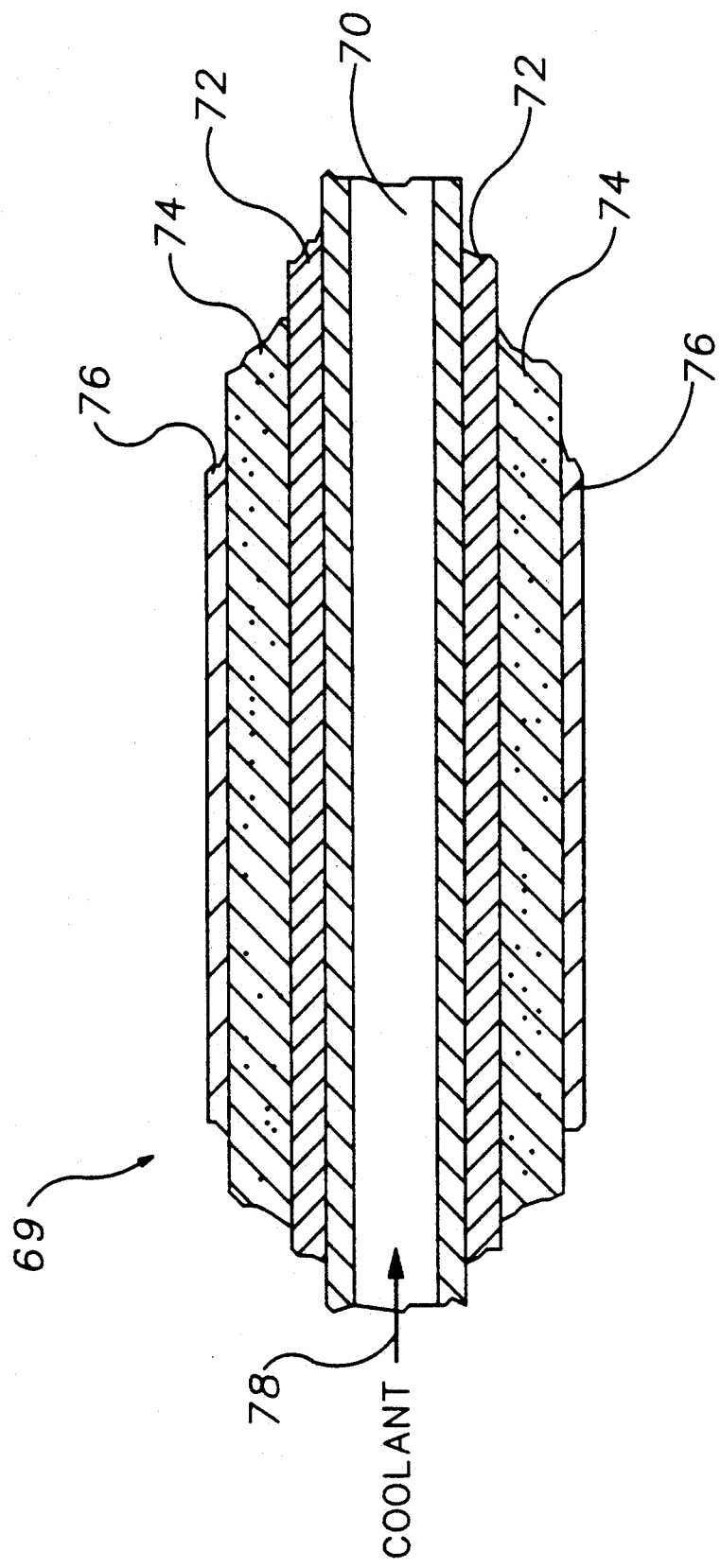
FIG. 6 is a cross-section of a superconducting transmission line in accordance with the present invention.

Referring now to FIG. 6, a superconducting transmission line 69 includes a tubular core 70, a superconductor layer 72 applied to an outer surface of the core 70, a thermally insulating layer 74 applied over the superconductor layer 72, and a protective layer 76 applied over the thermally insulating layer 74. A coolant 78, such as liquid or gaseous nitrogen ($N_2$) is caused to flow through the core 74 to cool the superconductor layer 72 to its transition temperature $T_c$.

The core 70 can be made from many materials, including metal, plastic, glass, etc. However, if the core 70 is made from metal, the transmission line 69 will always have good conductivity, even with the loss of the coolant 78. Further, if the core 70 is made from copper or a copper alloy, the task of applying copper-oxide based superconductor layer 72 is made easier due to the chemical similarities between the materials.

It should be noted that the superconductor layer 7 could be applied to an inner surface of core 70 instead of, or additionally to, being applied to its outer surface, as shown. However, from a process control viewpoint, it is often more difficult to apply a coating to an inner surface of a tube than its outer surface.

There are many methods for applying the superconductor layer 72 to the core 70. One such method is the well-known thermal spraying technique, which is also referred to as flame or plasma spraying. A number of publications teach thermal spraying techniques for ceramic materials, such as "Thermal Spraying of Ceramics", by P. Chagnon, Ceram. Int. (Italy) vol. 10, no. 4; "The Present Situation of Plasma Jet Spraying", by H. Nagasaka, Oyo Buturi (Japan), vol. 52, no. 10 (1983); and "Recent Developments in Plasma Spraying", by B.R. Wallace, Colloquium on Plasma Processing and Heating Applications, May 23, 1979.

The thermally insulating layer 74, which can be a plastic foam material, minimizes heat transfer between the superconducting transmission line 67 and the ambient environment. The protective layer 76, which can be plastic or rubber, protects the insulating layer 74 from the environment.

While this invention has been described with reference to several preferred embodiments, it is contemplated that various alterations and permutations of the invention will become apparent to those skilled in the art upon a reading of the preceding descriptions and a study of the drawing. It is therefore intended that the scope of the present invention be determined by the following appended claims.

What is claimed is:

1. A method for producing a superconductor wire comprising the steps of:
    making a coherent superconductor preform by forming a powdered superconductor precursor material into a preform and sintering the preform to convert the superconductor precursor material to a superconductor phase;
    heating a portion of said preform to approximately the melting temperature, $T_m$, of said superconductor material;
    drawing said portion of said preform into a wire having a smaller cross sectional area than the remainder of said preform; and
    cooling said wire to a temperature, $T_f$, that is much less than $T_m$.

2. A method for producing superconductor wire as recited in claim 1 further comprising the step of annealing said wire at a temperature which is much less than $T_m$.

3. A method for producing superconductor wire as recited in claim 1 further comprising a step of coating said wire.

4. A method for producing superconductor wire as recited in claim 3 wherein said coating is a material which is an insulator at ordinary room temperatures.

5. A method for producing superconductor wire as recited in claim 3 wherein said coating is a material which is a semiconductor at ordinary room temperatures.

6. A method for producing superconductor wire as recited in claim 3 wherein said coating is a material which is a conductor at ordinary room temperatures.

7. A method for producing superconductor wire as recited in claim 1, wherein said superconductor material has approximately the composition $Y_{2a}Ba_b Cu_cO_{3a+(3-d)b+c}$, where a, b, c and d are positive numbers and d = 1 or 2.

8. A method for producing superconductor wire as recited in claim 7, further comprising the step of choosing said combinations of said numbers a,b,c from the group of combinations consisting of 24,42,34; 15,53,32 and 18.5,65,16.5.

9. A method for producing superconductor wire as recited in claim 1, further comprising the steps of:
    providing a plurality of apertures extending through said wire in a direction transverse to a longitudinal axis of said wire; and
    filling said apertures with a material.

10. A method for producing superconductor wire as recited in claim 1, further comprising the steps of:
    providing a plurality of apertures extending through said wire in a direction transverse to a longitudinal axis of said wire; and
    flowing a fluid having a temperature is less than $T_c$, through said apertures.

11. A method for producing a superconductor capillary comprising the steps of:
    making a coherent tubular superconductor preform by forming a powdered superconductor precursor material into a preform and sintering the preform to convert the superconductor precursor material to a superconductor phase;
    heating a portion of said preform to approximately the melting temperature, $T_m$, of said superconductor material;
    drawing said portion of said preform into a capillary having a smaller cross sectional area than the remainder of said preform; and
    cooling said wire to a temperature, $T_f$, that is much less than $T_m$.

12. A method for producing superconductor capillary as recited in claim 1 further comprising a step of annealing said capillary at a temperature that is much less than $T_m$.

13. A method for producing superconductor capillary as recited in claim 11 further comprising a step of coating said capillary.

14. A method for producing superconductor capillary as recited in claim 13 wherein said coating is a material which is an insulator at ordinary room temperatures.

15. A method for producing superconductor capillary as recited in claim 13 wherein said coating is a material which is a semiconductor at ordinary room temperatures.

16. A method for producing superconductor capillary as recited in claim 13 wherein said coating is a material which is a conductor at ordinary room temperatures.

17. A method for producing superconductor wire as recited in claim 11 further comprising the step of filling a hollow interior portion of said capillary with a material.

18. A method for producing superconductor wire as recited in claim 17 wherein said capillary is filled with a gas.

19. A method for producing superconductor wire as recited in claim 17 wherein said capillary is filled with a liquid.

20. A method for producing superconductor wire as recited in claim 17 wherein said capillary is filled with a solid.

21. A method for producing superconductor wire as recited in claim 20 wherein said solid is a conductive material at ordinary room temperatures.

22. A method for producing superconductor capillary as recited in claim 11, wherein said superconducting material has approximately the composition $Y_{2a}Ba_bCu_cO_{3a+(3-d)b+c}$, where a, b,c and d are positive numbers and d=1 or 2.

23. A method for producing superconductor capillary as recited in claim 22, further comprising the step of choosing said combinations of said integers a,b,c from the group of combinations consisting of 24,42,34: 15,53,32 and 37,130,33.

24. A method for producing superconductor capillary as recited in claim 11, further comprising the step of flowing a fluid having a temperature is less than $T_c$, through said hollow interior of said capillary.

25. A method for producing superconductor wire comprising the steps of:
    making a coherent superconductor preform by forming a powdered superconductor precursor material into a preform and sintering the preform to convert the superconductor precursor material to a superconductor phase, said coherent preform having a first end and a second end;
    heating a selected portion of the preform near said first end to approximately the melting temperature, $T_m$, of said superconductor material while the remainder of the preform between the selected portion and said second end is maintained at temperatures much less than $T_m$;
    allowing the position of the selected portion of the preform to move from the first preform end toward the second preform end;
    drawing the selected portion of the preform into a wire having a longitudinal axis and having a diameter that is smaller than the diameter of the remainder of the preform; and
    cooling the wire to a temperature, $T_f$, that is much less than $T_m$.

26. The method for producing superconductor wire as recited in claim 25, wherein said superconducting material has approximately the composition $(A_xE_{1-x})_aCu_bO_y$, where a,b,x and y are positive numbers with $0<x<1$, the element A is either Y or La, and the element E is either Ba or Sr.

27. A method for producing superconductor wire as recited in claim 26, the method further comprising steps of choosing A=Y, E=Ba, x=0.4, a=2, b=1 and $y\leq 4$.

28. A method for producing superconductor wire as recited in claim 26, the method further comprising steps of choosing A=Y, E=Ba, x=0.667, a=3, b=3 and y=6-8.

29. A method for producing superconductor capillary comprising the steps of:
    making a coherent superconductor preform by forming a powdered superconductor precursor material into a preform and sintering the preform to convert the superconductor precursor material to a superconductor phase, said material having a superconducting transition temperature, $T_c$, and having approximately the composition $(A_xE_{1-x})_aCu_bO_y$, where a,b,x and y are positive numbers with $0<x<1$, the element A is either Y or La, and the element E is either Ba or Sr, the preform having a first end a second end and having the form of a tube;
    heating a selected portion of the preform near the first end thereof to approximately the melting temperature, $T_m$, of said superconductor material while the remainder of the preform between the selected portion and the second end is maintained at temperatures much less than $T_m$;
    allowing the position of the selected portion of the preform to move from the first preform end toward the second preform end;
    drawing the selected portion of the preform into a capillary having a hollow interior and having another diameter that is smaller than the diameter of the remainder of the preform; and
    cooling the wire to a temperature, $T_f$, that is much less than $T_m$.

30. A method for producing superconductor capillary as recited in claim 29, wherein said superconducting material has approximately the composition $(A_xE_{1-x})_aCu_bO_y$, where a,b,x and y are positive numbers with $0<x<1$, the element A is either Y or La, and the element E is either Ba or Sr, the preform having a first end and a second end.

31. A method for producing superconductor capillary as recited in claim 30, the method further comprising steps of choosing A=Y, E=Ba, x=0.4, a=2, b=1, and $y\leq 4$.

32. A method for producing superconductor capillary as recited in claim 30, the method further comprising steps of choosing A=Y, E=Ba, x=0.667, a=3, b=3 and y=6-8.

* * * * *